United States Patent
Motwani

(10) Patent No.: US 9,798,622 B2
(45) Date of Patent: Oct. 24, 2017

(54) APPARATUS AND METHOD FOR INCREASING RESILIENCE TO RAW BIT ERROR RATE

(71) Applicant: INTEL CORPORATION, Santa Clara, CA (US)

(72) Inventor: Ravi H. Motwani, San Diego, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/557,070

(22) Filed: Dec. 1, 2014

(65) Prior Publication Data
US 2016/0156372 A1 Jun. 2, 2016

(51) Int. Cl.
G06F 11/10 (2006.01)
G06F 12/02 (2006.01)
H03M 13/29 (2006.01)
H03M 13/15 (2006.01)

(52) U.S. Cl.
CPC ........ *G06F 11/1092* (2013.01); *G06F 11/108* (2013.01); *G06F 11/1068* (2013.01); *G06F 11/1076* (2013.01); *G06F 12/0246* (2013.01); *H03M 13/2909* (2013.01); *H03M 13/152* (2013.01)

(58) Field of Classification Search
CPC ............. G06F 11/1092; G06F 11/1068; G06F 11/108; G06F 12/0246
See application file for complete search history.

(56) References Cited

U.S. PATENT DOCUMENTS

| | | | | |
|---|---|---|---|---|
| 6,101,615 A * | 8/2000 | Lyons | ................ | G06F 11/1076 711/114 |
| 6,140,947 A * | 10/2000 | Livingston | .............. | H03M 7/46 341/106 |
| 6,301,558 B1 * | 10/2001 | Isozaki | ................ | G10L 19/005 704/228 |
| 6,687,860 B1 * | 2/2004 | Iijima | ................ | G06F 12/0207 365/201 |

(Continued)

FOREIGN PATENT DOCUMENTS

KR 10-2008-0088989 A 10/2008

OTHER PUBLICATIONS

International Search Report and Written Opinion for International Patent Application No. PCT/US2015/056102, dated Jan. 29, 2016.

(Continued)

*Primary Examiner* — Joseph D Torres
(74) *Attorney, Agent, or Firm* — Green, Howard & Mughal LLP.

(57) ABSTRACT

Described is an apparatus which comprises: a first encoder to encode data with a first error correction scheme to generate a set of codewords, each codeword of the set having a data portion and a corresponding parity portion, and each codeword of the set to be stored in a separate memory bank of a memory block; and a second encoder to encode the data portions of each codeword of the set with a second error correction scheme, the second encoder to generate a combined codeword having a data portion and a corresponding parity portion, wherein the corresponding parity portion of the combined codeword is to be stored in an additional memory bank of the memory block.

24 Claims, 6 Drawing Sheets

(56) References Cited

U.S. PATENT DOCUMENTS

| | | | |
|---|---|---|---|
| 8,601,339 B1* | 12/2013 | Cypher | H03M 13/2909 714/752 |
| 8,839,072 B2* | 9/2014 | Uchida | G06F 11/1012 714/758 |
| 8,984,368 B2* | 3/2015 | Loh | G06F 11/1044 714/763 |
| 2004/0003336 A1* | 1/2004 | Cypher | G11C 29/42 714/763 |
| 2004/0066676 A1* | 4/2004 | Lee | G11C 11/406 365/200 |
| 2004/0090840 A1* | 5/2004 | Lee | G11C 11/406 365/200 |
| 2004/0123223 A1* | 6/2004 | Halford | G06F 11/1076 714/781 |
| 2005/0270855 A1* | 12/2005 | Earhart | G11B 20/1217 365/189.05 |
| 2007/0067704 A1* | 3/2007 | Altintas | H03M 13/27 714/795 |
| 2008/0244362 A1 | 10/2008 | Liu et al. | |
| 2010/0162053 A1* | 6/2010 | Gillingham | G06F 11/10 714/49 |
| 2011/0004805 A1* | 1/2011 | Seo | G06F 11/1048 714/763 |
| 2011/0004812 A1 | 1/2011 | Yang | |
| 2011/0107013 A1* | 5/2011 | Ho | G06F 11/1044 711/103 |
| 2011/0258362 A1* | 10/2011 | McLaren | G06F 3/0611 711/5 |
| 2011/0264986 A1* | 10/2011 | Chin | H03M 13/114 714/763 |
| 2012/0159285 A1* | 6/2012 | Motwani | H03M 13/1102 714/767 |
| 2012/0233498 A1* | 9/2012 | Ramaraju | G06F 11/1064 714/23 |
| 2013/0121075 A1* | 5/2013 | Hutchison | G11C 11/5628 365/185.11 |
| 2013/0227368 A1* | 8/2013 | Ramaraju | G06F 11/0754 714/746 |
| 2013/0262957 A1* | 10/2013 | Wu | G06F 11/1064 714/763 |
| 2014/0122963 A1 | 5/2014 | Motwani et al. | |
| 2014/0157082 A1 | 6/2014 | Kim | |
| 2014/0351669 A1 | 11/2014 | Anholt et al. | |

OTHER PUBLICATIONS

International Preliminary Report on Patentability for International Patent Application No. PCT/US2015/056102, dated on Jun. 15, 2017.

* cited by examiner

APPARATUS AND METHOD FOR INCREASING RESILIENCE TO RAW BIT ERROR RATE

BACKGROUND

Error Correction Codes (ECCs) are used to protect data from Raw Bit Error rate (RBER). The term "RBER" here generally refers to the rate of errors when reading from a non-volatile memory. To achieve diversity in RBER, the ECC codewords are distributed over multiple non-volatile memory dies such that if there is any fatal non-volatile memory die, mechanisms are used to correct the data in the fatal die. Multiple non-volatile memory dies are combined into a logical unit for data redundancy. The data in the fatal die can be corrected using the Exclusive-OR (XOR) of the contents of all the non-volatile memory dies in the logical unit. However, further resilience in the RBER is desired.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
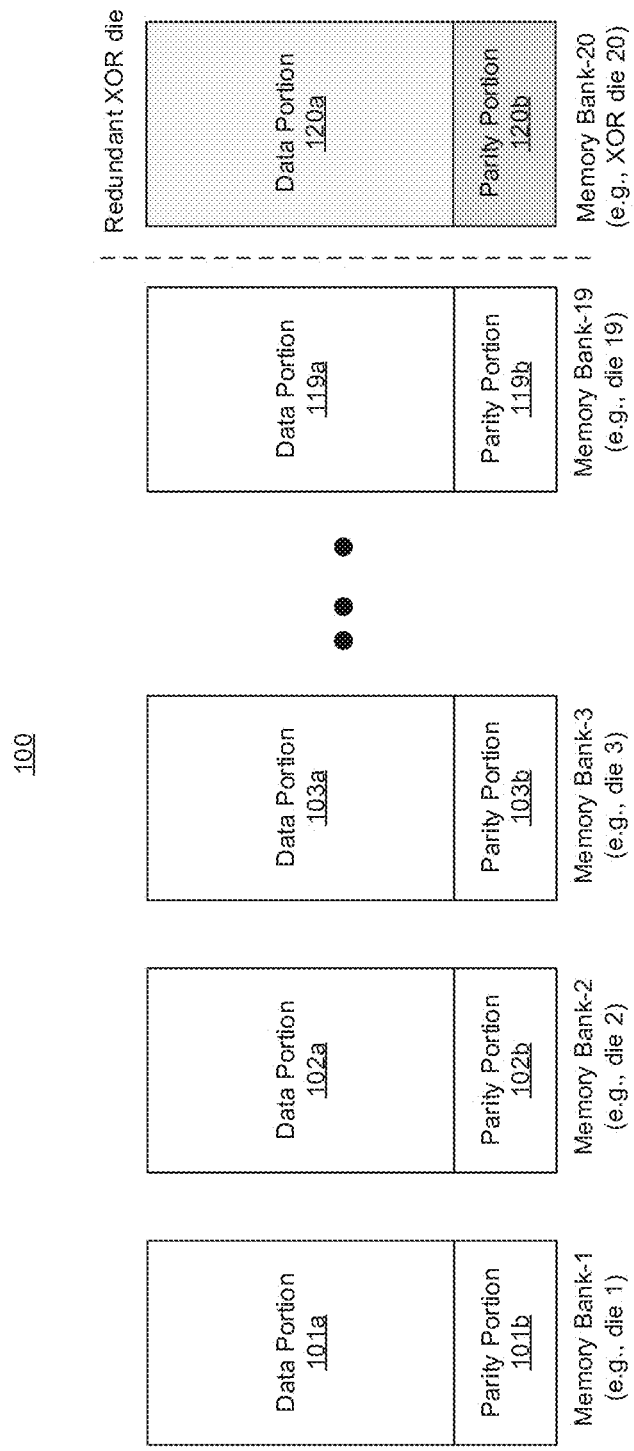
FIG. 1 illustrates an encoding scheme.

Some Error Correction Code (ECC) schemes distribute codewords generated from an encoder to individual semiconductor dies (or simply dies) such that one of the dies stores the Exclusive-OR (XOR) of the codewords stored in the other dies. These dies can be memories such as non-volatile memories. In one example, an encoder may perform 256 Byte Bose-Chaudhuri-Hocquenghem (BCH) encoding on data such that the encoded codewords are distributed in 19 dies as shown in encoding scheme 100 of FIG. 1. Each encoded codeword in this example of 19 dies consists of 230 Bytes of data information (i.e., 101a through 119a) and 26 Bytes of corresponding parity information (i.e., 101b through 119b).

In this example, a total of 4 Kilo Bytes of (KB) of the codeword is stored in the 19 dies, while the $20^{th}$ die stores the resultant XOR (i.e., data portion 120a and parity portion 120b) of the codewords stored in dies 1 through 19. In case of any fatal die among dies 1 through 19, the data in the $20^{th}$ die generated from the XOR-ing process is used to recover the contents of the fatal die. The term "fatal die" here generally refers to a memory die which has a failed codeword. In the case of no fatal die, the data in the $20^{th}$ die generated from the XOR-ing process is mostly unused. Here, the $20^{th}$ die is the redundant die.

Continuing with the example of 20 dies, in some embodiments, resilience to RBER can be improved or increased by using the $20^{th}$ die to store the parity of a super-BCH codeword instead of storing the resultant XOR of the codewords of the other 19 dies. In some embodiments, the super-BCH codeword comprises a data portion (or information component) and a corresponding parity portion (or parity component). In this example, the super-BCH codeword comprises 230 Bytes of information component per die (i.e., 19 dies×230 Bytes) and 230 Bytes of a parity component. In some embodiments, the 230 Bytes of the parity component is stored in the $20^{th}$ die. In some embodiments, this parity component in the $20^{th}$ die is then BCH encoded using the smaller regular data per die BCH encoded data portions to generate a parity portion of the parity component in the $20^{th}$ die.

In this example, the super-BCH codeword is over a field based on 16 symbols and can correct 115 bit errors. In other examples, fewer or more than 115 bit errors can be corrected according to some embodiments. One technical effect of some embodiments is that the apparatus improves resilience to RBER by 10× compared to the scheme that uses XOR-ed data in the redundant die for correcting contents in a fatal die. The scheme of various embodiments works resiliently with components that give high RBER (i.e., various embodiments operate well even when RBER worsens/increases).

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical or wireless connection between the things that are connected, without any intermediary devices. The term "coupled" means either a direct electrical or wireless connection between the things that are connected or an indirect connection through one or more passive or active intermediary devices. The term "signal" means at least one current signal, voltage signal or data/clock signal. The meaning of "a," "an," and "the" include plural references. The meaning of "in" includes "in" and "on."

The terms "substantially," "close," "approximately," "near," and "about," generally refer to being within +/−20% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Figure 2:
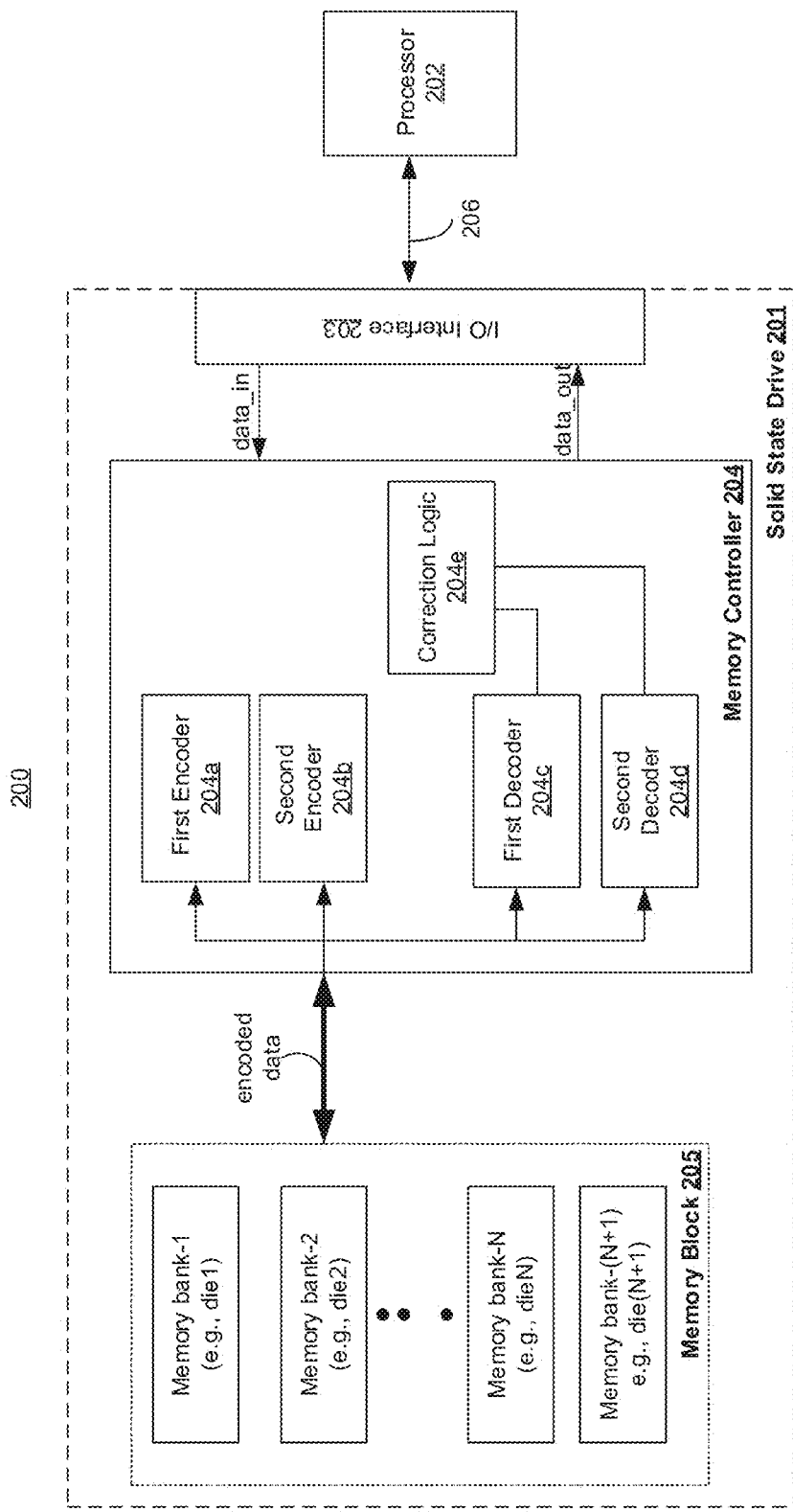
FIG. 2 illustrates an architecture with an apparatus to improve or increase resilience to Raw Bit Error Rate (RBER), according to some embodiments of the disclosure.

FIG. 2 illustrates architecture 200 with an apparatus to improve resilience to RBER, according to some embodiments of the disclosure. In some embodiments, architecture 200 includes storage unit 201 and Processor 202. In some embodiments, storage unit 201 is a Solid State Drive (SSD). In other embodiments, other types of storage units may be used. In some embodiments, Processor 202 is a microprocessor (such as those designed by Intel Corporation of Santa Clara, Calif.), Digital Signal Processors (DSPs), Field-Programmable Gate Arrays (FPGAs), Application Specific Integrated Circuits (ASICs), or Radio-Frequency Integrated Circuits (RFICs), etc.

So as not to obscure the embodiments, a simplified version of memory architecture 200 is shown. A person skilled in the art would appreciate that there are other logic and circuits needed for complete operation of architecture 200. For example, syndrome calculators, queues, input-output buffers, etc., are not shown.

In some embodiments, SSD 201 includes I/O interface 203, Memory Controller 204, and a plurality of memory banks logically combined as Memory Block 205. In some embodiments, I/O interface 203 is a Serial Advanced Technology Attachment (SATA) interface and interconnect 206 is a SATA compliant bus coupling SSD 201 to Processor 202. In other embodiments, other types of I/O interfaces may be used for I/O interface 203. For example, Serial Attached Small Computer System face (SCSI) (or simply SAS) may be used for I/O interface 203, and interconnect 206 is a SAS compliant interface; or Peripheral Component Interconnect Express (PCIe) as described in the PCI Express Base 3.0 Specification may be used for I/O interface 203.

While the embodiment of FIG. 2 is illustrated with two distinct components in SSD 201 and Processor 202, in some embodiments, storage unit 201 and Processor 202 can be packaged together as a single unit. In some embodiments, storage unit 201 and Processor 202 are implemented using three dimensional integrated circuit (3D IC) technology where various dies are stacked on each other. For example, various dies or components of SSD 201 may be implemented as dies that are stacked on a die of Processor 202 to form a stacked or 3D IC.

Here, memory banks (i.e., Memory bank-1 to Memory bank-(N+1), where 'N' is an integer) in Memory Block 205 are shown as a group of memory banks in one area. The terms "die" and "bank" here are interchangeable used and generally refer to an integrated circuit that may be packaged separately or integrated with other circuits. In some embodiments, the memory banks (or dies1 to dies (N+1)) may be distributed in SSD 201. In some embodiments, each memory bank is non-volatile memory. For example, each memory bank is a single or multi-threshold level NAND flash memory, NOR flash memory, single or multi-level Phase Change Memory (PCM), a three dimensional cross point memory, a resistive memory, nanowire memory, ferro-electric transistor random access memory (FeTRAM), magne-toresistive random access memory (MRAM) memory that incorporates memristor technology, spin transfer torque (STT)-MRAM, or a combination of any of the above, etc.

In some embodiments, Memory Controller 204 includes First Encoder 204a, Second Encoder 204b, First Decoder 204c, Second Decoder 204d, and Correction Logic 204e. In some embodiments, First Encoder 204a applies a first error correction scheme to input data (data_in) and generates encoded data (i.e., codewords). Each codeword includes a data portion and a corresponding parity portion. In some embodiments, the codewords are distributed to memory banks (i.e., Memory bank-1 through Memory bank-N).

In some embodiments, Second Encoder 204b applies a second error correction scheme to the data portions of the generated codewords to generate a super codeword (also referred to here as a combined codeword). The super codeword includes a data portion and a corresponding parity portion. In some embodiments, the corresponding parity portion of the super codeword is stored in an additional memory bank (i.e., Memory bank-(N+1)). In some embodiments, First Encoder 204a is used to encode the corresponding parity portion of the super codeword to generate another parity which is stored in the additional memory bank (i.e., Memory bank-(N+1)).

In some embodiments, Second Encoder 204b generates the parity portion (i.e., the data portion of the combined or super codeword) such that the parity portion of the combined codeword has a size which is at least equal to the size of the data portion of one of the codewords of the set of codewords, where the set of codewords is the set generated by First Encoder 204a when it encodes input data data_in. In some embodiments, Second Encoder 204b generates the combined or super codeword such that the combined or super codeword has a size which is substantially larger than the size of one of the codewords of the set. In some embodiments, Second Encoder 204b generates the combined codeword such that the combined codeword has a size which is substantially equal to a sum of the sizes of the codewords of the set.

In some embodiments, the first or second error correction scheme is one of: BCH scheme; Low-Density Parity-Check Code (LDPC) scheme; Cyclic Redundancy Check (CRC) scheme; Hamming Code scheme, or Convolutional code scheme. In some embodiments, the first error correction scheme is different from the second error correction scheme. For example, the first error correction scheme is a BCH scheme and the second error correction scheme is an LDPC scheme. In some embodiments, the first error correction scheme is the same as the second error correction scheme. For example, the first error correction scheme is a BCH scheme and the second error correction scheme is also a BCH scheme.

In some embodiments, Memory Controller 204 communicates with Memory Block 205 (i.e., the various memory dies) via an Input/Output (I/O) interface and corresponding compliant bus 207. In some embodiments, Memory Controller 204 communicates with Memory Block 205 via an interface which is complaint to the Open NAND Flash Interface (ONFI) specification (e.g., Revision 4.0 released Apr. 2, 2014). In other embodiments, other types of interfaces may be used for communicating between Memory Controller 204 and Memory Block 205.

In some embodiments, First Decoder 204c decodes encoded data from Memory banks-1 through Memory bank-N. In some embodiments, First Decoder 204c applies the first error correction scheme to decode the codewords encoded by First Encoder 204b. In some embodiments, Second Decoder 204d decodes encoded data from Memory bank-(N+1). In some embodiments, Second Decoder 204d applies the second error correction scheme to decode the super codeword encoded by Second Encoder 104b. In some embodiments, Correction Logic 204e corrects faults in one or more memory banks (i.e., Memory banks-1 to Memory banks-N) using the decoded super codeword (or part of it)

and some or all of the decoded codewords stored in Memory banks-1 to Memory banks-N. The corrected output is then provided as output data data_out for processing by Processor 202.

In some embodiments, when a die failure occurs (i.e., one of Memory bank-1 through Memory bank-N fails to operate properly and/or data in that die is corrupted), the codewords per die are decoded except for the codeword stored in the fatal die. In some embodiments, if all the codewords in Memory bank-1 through Memory bank-N succeed in decoding by First Decoder 204c, the super codeword from Memory bank-(N+1) is then used to fix the corrupted data in the faulty die. In some embodiments, Correction Logic 204e applies an erasure reconstruction process to recover the data portion of the codeword stored in the fatal die.

In some embodiments, when more than two codewords stored in Memory bank-1 through Memory bank-N fail to decode, then Correction Logic 204e applies the super codeword from Memory bank-(N+1) to attempt recovery. In some embodiments, all codewords per die are decoded except for the codeword in the fatal die. If the codewords per die are decoded successfully (minus the codeword in the fatal die which is not decoded), then the super codeword stored in Memory bank-(N+1) is used by Correction Logic 104e to correct errors in the dies which failed decoding (i.e., exhibited ECC failures). Such a correction scheme improves resilience to RBER over traditional correction schemes that use XOR-ed result in a redundant die for data recovery purposes.

Figure 3:
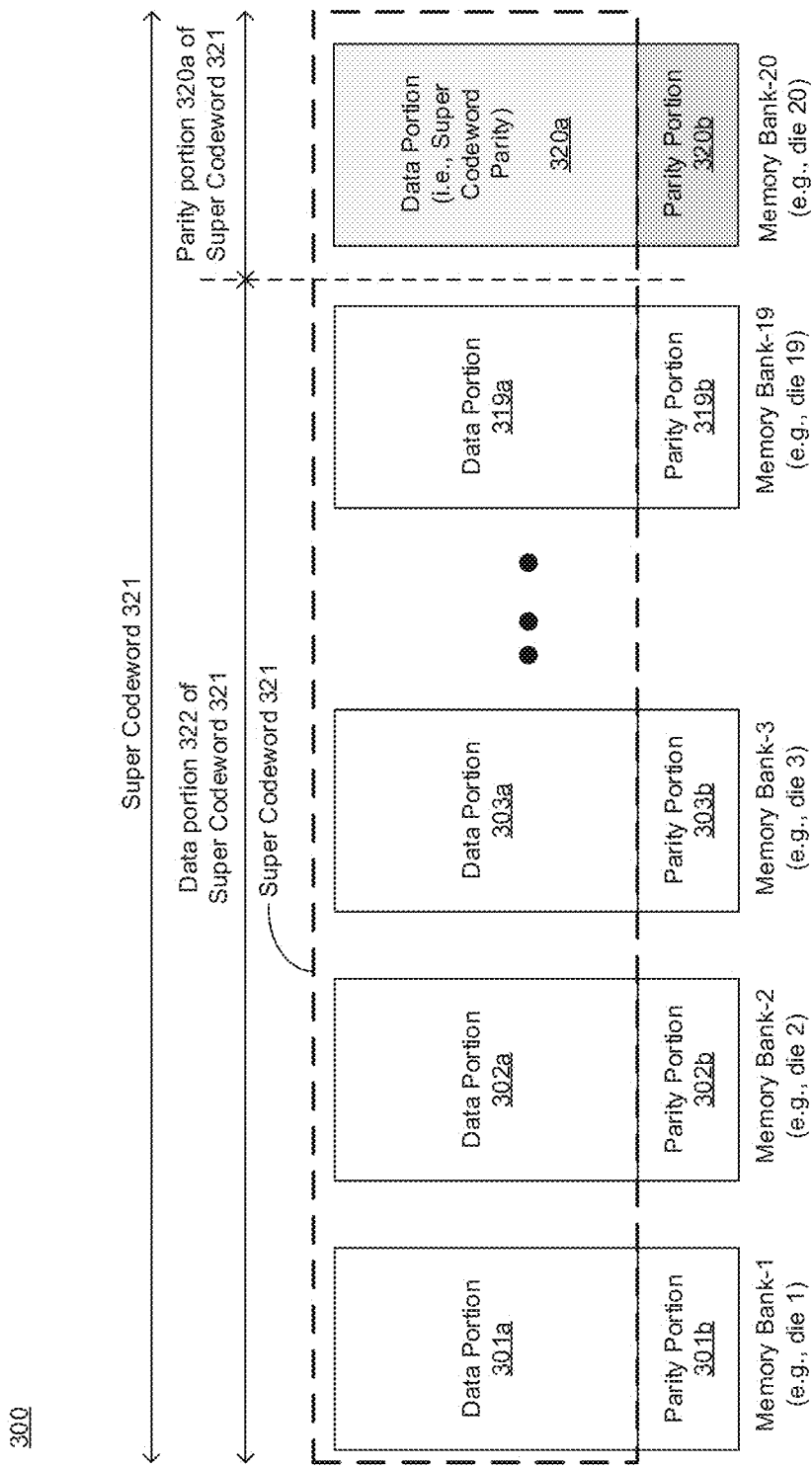
FIG. 3 illustrates an encoding scheme to improve resilience to RBER, according to some embodiments of the disclosure.
Figure 4:
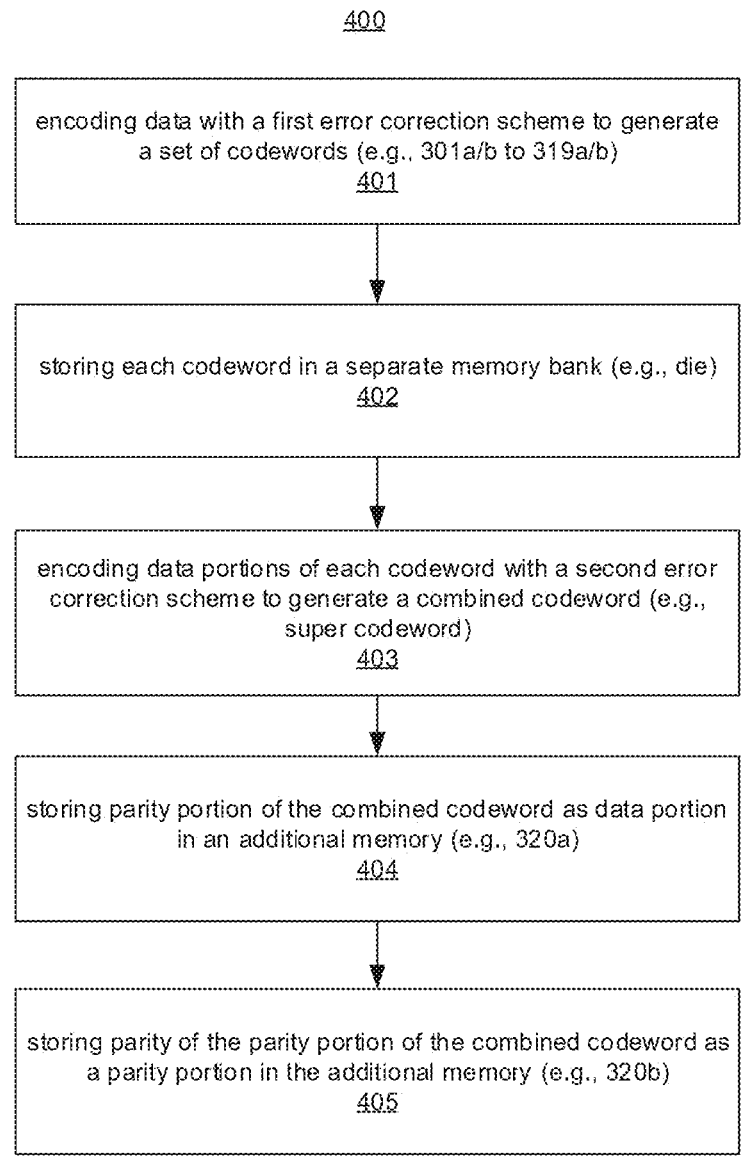
FIG. 4 illustrates a flowchart of a method for encoding data across multiple dies or storage banks to improve resilience to RBER, according to some embodiments of the disclosure.
Figure 5:
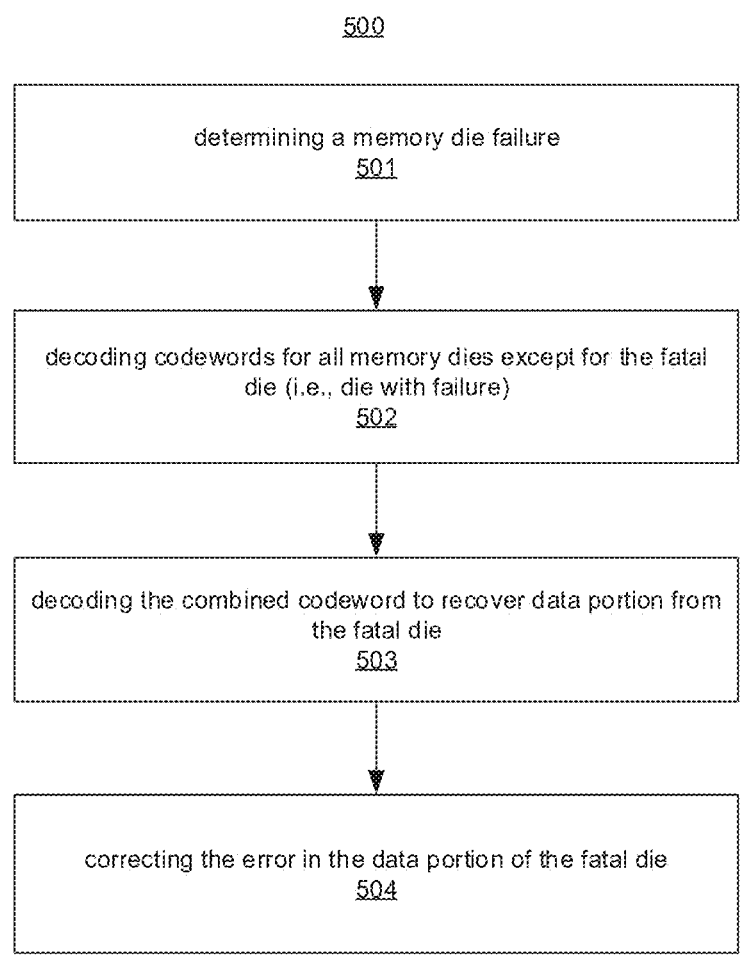
FIG. 5 illustrates a flowchart of a method for decoding the encoded data and correcting data in a fatal die among multiple dies or storage banks such that the resilience to RBER is improved, according to some embodiments of the disclosure.

So as not to obscure the embodiments, FIGS. 3-5 are described with reference to 19 memory dies (i.e., N=19) and a redundant $20^{th}$ memory die (i.e., Memory bank-(N+1)) in an SSD, 256 Byte BCH encoding/decoding scheme, and 4 KB of data in which is encoded and then stored in Memory Block 205. However, the embodiments can be extended to any number of memory bank/dies, different types of storage devices, and different sizes for input data.

FIG. 3 illustrates encoding scheme 300 to improve resilience to RBER, according to some embodiments of the disclosure. It is pointed out that those elements of FIG. 3 having the same reference numbers (or names) as the elements of any other figure can operate or function in any manner similar to that described, but are not limited to such.

Encoding scheme 300 illustrates a logical partitioning of the memory dies. Each memory die includes a data portion and a corresponding parity portion. In some embodiments, First Encoder 204a encodes the 4 KB of input data data_in using BCH encoding scheme such that the resulting codeword (i.e., the encoded codeword) is distributed as 256 Bytes of sub-codewords between 19 memory dies (i.e., Memory Bank-1 to Memory Bank-19). In this embodiment, each 256 Bytes of sub-codeword (i.e., the distributed codeword stored in a memory die) includes 230 Bytes of data portion and 26 Bytes of parity portion.

For example, 230 Bytes of Data Portion 301a and corresponding 26 Bytes of parity portion 301b are stored in Memory Bank-1 (e.g., memory die 1); 230 Bytes of Data Portion 302a and corresponding 26 Bytes of parity portion 302b are stored in Memory Bank-2 (e.g., memory die 2), 230 Bytes of Data Portion 303a and corresponding 26 Bytes of parity portion 303b are stored in Memory Bank-2 (e.g., memory die 2); and so on such that the last 230 Bytes of Data Portion 319a and corresponding 26 Bytes of parity portion 319b are stored in Memory Bank-19 (e.g., memory die 19).

In some embodiments, Second Encoder 204b generates Super Codeword 321 which comprises data portion 322 and corresponding parity portion 320a. Here, the data portion of Super Codeword 321 is the data portions stored in the 19 memory banks (i.e., Data Portions 301a, 302a, 303a, . . . 319a). In some embodiments, Second Encoder 204b generates a Parity Portion 320a of Super Codeword 321 which is stored in a data portion or region of the redundant memory bank (here, Memory Bank-20). In some embodiments, the size of Parity Portion 320a of Super Codeword 321 is the same size of a data portion of any of Memory Bank-1 though Memory Bank-19. For example, the size of Parity Portion 320a of Super Codeword 321 is 230 Bytes which is the same as the size of Data Portion 301a of the codeword stored in memory die 1.

In some embodiments, First Encoder 220a generates Parity Portion 320b which is the parity of Parity Portion 320a of Super Codeword 321. In some embodiments, Parity Portion 320b is stored in Memory Bank-20. In some embodiments, the size of Parity Portion 320b is the same as the size of a parity portion of any of Memory Bank-1 though Memory Bank-19. For example, the size of Parity Portion 320b is 26 Bytes which is the same as the size of Parity Portion 301b of the codeword stored in memory die 1.

In some embodiments, Super Codeword 321 comprises the information component, which is the cumulative 230 Bytes per die for the 19 dies plus 230 Bytes of parity information 320a. In some embodiments, the 230 Bytes of parity information 320a is stored in the $20^{th}$ die. In some embodiments, this parity information 320a is then BCH encoded by First Encoder 204a using the smaller regular per die BCH code. Here, Super BCH Codeword 321 is over a field based on 16 symbols and can correct 115 bit errors.

When a fatal die is identified in any one of dies 1-19, BCH codeword per die is decoded by First Decoder 204c except for the BCH codeword in the fatal die, according to some embodiments. In some embodiments, when all the 19 BCH codewords are successfully decoded by First Decoder 204c, Super BCH Codeword 321 is then applied and an erasure reconstruction mechanism is used by Correction Logic 204e to recover the 230 Bytes from the fatal die.

When more than two BCH codewords in any two or more of the dies 1-19 fail decoding by First Decoder 204c, then again Super BCH Codeword 321 is used to attempt recovery of the failed codewords. In some embodiments, the BCH codewords in the non-fatal dies are decoded. In some embodiments, when the BCH codewords succeed decoding, then Super BCH codeword 321 is used to correct errors in the dies which suffered ECC failures. Since Super BCH codeword 321 can correct up to 115 errors, there is a much higher chance that the previously failed decoding process now succeeds decoding. This improves or increases resilience to RBER by 10× over ECC mechanisms that use XORed data in the redundant die (i.e., a $20^{th}$ die) to fix errors in any of the 19 dies.

FIG. 4 illustrates flowchart 400 of a method for encoding data across multiple dies or storage banks to improve resilience to RBER, according to some embodiments of the disclosure. It is pointed out that those elements of FIG. 4 having the same reference numbers (or names) as the elements of any other figure can operate or function in any manner similar to that described, but are not limited to such.

Although the blocks in the flowchart with reference to FIG. 4 are shown in a particular order, the order of the actions can be modified. Thus, the illustrated embodiments can be performed in a different order, and some actions/blocks may be performed in parallel. Some of the blocks and/or operations listed in FIG. 4 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 401, input data in is encoded by First Encoder 204a with a first error correction scheme (e.g., BCH scheme) to generate a set of codewords (e.g., 301a/b to 319a/b). At block 402, each codeword is stored in a separate die or memory bank. For example, Memory Bank-1 stores data portion 301a and corresponding parity portion 301b; Memory Bank-2 stores data portion 302a and corresponding parity portion 302b, and so on. At block 403, Second Encoder 204b generates Super BCH Codeword 321 using a second error correction scheme (e.g., BCH scheme) by encoding data portions of each codeword generated by First Encoder 204a. At block 404, parity portion of the combined codeword (i.e., Super BCH Codeword 321) is stored in the region dedicated for the data portion storage in additional memory. For example, Parity Portion 320a is stored in the $20^{th}$ die, which is the redundant die. At block 404, First Encoder 204a stores parity of Parity Portion 320a in the $20^{th}$ die (i.e., the additional memory).

FIG. 5 illustrates flowchart 500 of a method for decoding the encoded data and correcting data in a fatal die among multiple dies or storage banks such that resilience to RBER is improved, according to some embodiments of the disclosure. It is pointed out that those elements of FIG. 5 having the same reference numbers (or names) as the elements of any other figure can operate or function in any manner similar to that described, but are not limited to such.

Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 501, a memory die failure is determined. For example, data in a memory die becomes corrupted for any number of reasons. Any known method for identifying a fatal die can be used. Various embodiments are then used to correct the error in the codeword. At block 502, the process of correcting the error begins by decoding codewords for all memory dies except for the fatal die (i.e., the die that has a failed codeword). For example, First Decoder 204c decodes the codewords in Memory Banks 1 through 19 except for the memory bank that failed.

At block 503, Super BCH codeword 321 is decoded by Second Decoder 204d to recover the data from the fatal memory die. At block 504, error in the data portion of the fatal die is corrected using the decoded Super BCH codeword 321. In some embodiments, in the case of die failures, the super-BCH decoding is erasures decoding. In some embodiments, in the case of multiple codeword failure (i.e., no die failure), the super-BCH decoding is any regular error correction method.

Figure 6:
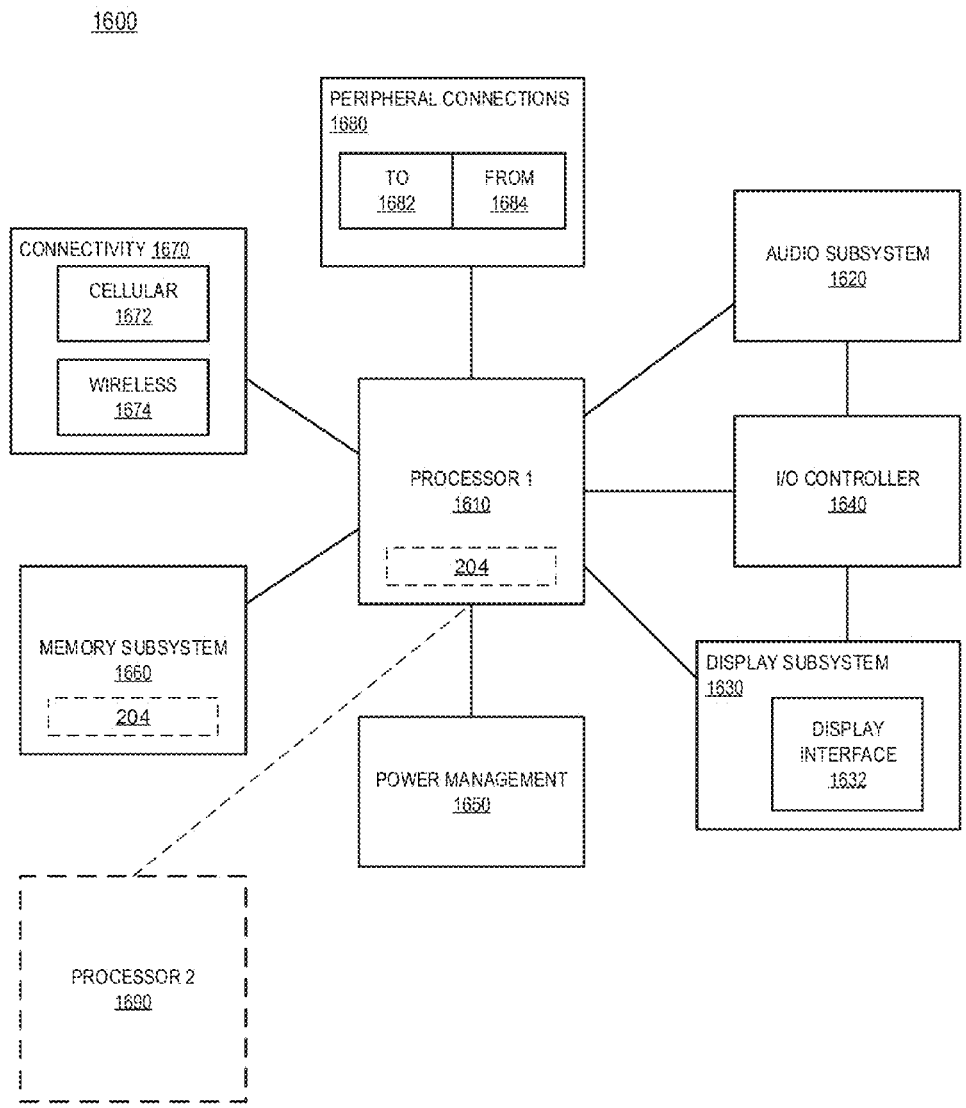
FIG. 6 illustrates a smart device or a computer system or a SoC (System-on-Chip) with apparatus to improve resilience to RBER, according to some embodiments.

FIG. 6 illustrates a smart device or a computer system or a SoC (System-on-Chip) with apparatus of memory controller 204 to improve resilience to RBER, according to some embodiments. FIG. 6 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 with apparatus of memory controller 204 to improve resilience to RBER, according to some embodiments discussed. Other blocks of the computing device 1600 may also include apparatus of memory controller 204 to improve resilience to RBER, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 includes Display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 includes I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. In some embodiments, Memory subsystem 1600 includes apparatus of memory controller 204 to improve resilience to RBER, according to some embodiments.

Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, PCM, or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first encoder to encode data with a first error correction scheme to generate a set of codewords, each codeword of the set having a data portion and a corresponding parity portion, and each codeword of the set to be stored in a separate memory bank of a memory block; and a second encoder to encode the data portions of each codeword of the set with a second error correction scheme, the second encoder to generate a combined codeword having a data portion and a corresponding parity portion.

In some embodiments, the corresponding parity portion of the combined codeword is to be stored in an additional memory bank of the memory block. In some embodiments, the first encoder to encode the parity portion of the combined codeword to generate a corresponding parity which is stored in the additional memory bank of the memory block. In some embodiments, the apparatus comprises logic to determine which separate memory bank in the memory block failed.

In some embodiments, the apparatus comprises: a first decoder to decode at least one codeword of the set of codewords. In some embodiments, the apparatus comprises a second decoder to decode the combined codeword. In some embodiments, the second decoder decodes the combined codeword after decoding all codewords of the set, and wherein data portions of each codeword of the set comprise the data portion of the combined codeword. In some embodiments, the apparatus comprises a correction logic to correct a codeword, stored in the separate memory bank which failed, using the decoded combined codeword. In some embodiments, the correction logic is operable to use erasure reconstruction technique to recover the data portion of the codeword, which is stored in the separate memory bank which failed.

In some embodiments, the second encoder generates the parity portion such that the parity portion of the combined codeword has a size which is at least equal to the size of the data portion of one of the codewords of the set. In some embodiments, the second encoder generates the combined codeword such that the combined codeword has a size which is substantially larger than the size of one of the codewords of the set. In some embodiments, the second encoder generates the combined codeword such that the combined codeword has a size which is substantially equal to a sum of the sizes of the codewords of the set.

In some embodiments, the first error correction scheme is different from the second error correction scheme. In some embodiments, the first error correction scheme is the same as the second error correction scheme. In some embodiments, the first or second error correction scheme is one of: Bose-Chaudhuri-Hocquenghem (BCH) scheme; Low-Density Parity-Check Code (LDPC) scheme; Cyclic Redundancy Check (CRC) scheme; or Convolutional code scheme. In some embodiments, the memory bank is a memory die. In some embodiments, the memory die is a non-volatile memory die.

In another example, a method is provided which comprises: encoding data with a first error correction scheme to generate a set of codewords, each codeword of the set having a data portion and a corresponding parity portion; storing each codeword of the set in a separate memory bank of a memory block; encoding the data portions of each codeword of the set with a second error correction scheme, the combined codeword having a data portion and a corresponding parity portion; and storing the corresponding parity portion of the combined codeword in an additional memory bank of the memory block.

In some embodiments, the method comprises encoding the parity portion of the combined codeword to generate a corresponding parity; and storing the corresponding parity to the additional memory bank of the memory block. In some embodiments, the method comprises determining which separate memory bank in the memory block failed.

In some embodiments, the method comprises: decoding the combined codeword after decoding all codewords of the set, and wherein data portions of each codeword of the set comprise the data portion of the combined codeword; and correcting at least one of the codewords, stored in the separate memory bank which failed, using the decoded combined codeword.

In another example, a system is provided which comprise: a processor; a solid state drive (SSD) coupled to the processor, the SSD including: a plurality of non-volatile memory (NVM) dies; a memory controller coupled to the plurality NVM dies, the memory controller including: a first encoder to encode data with a first error correction scheme to generate a set of codewords, each codeword of the set having a data portion and a corresponding parity portion, and each codeword of the set to be stored in a separate memory die of the plurality NVM dies; and a second encoder to encode the data portions of each codeword of the set with a second error correction scheme, the second encoder to generate a combined codeword having a data portion and a corresponding parity portion; and a wireless interface for allowing the processor to wirelessly communicate with another device.

In some embodiments, the corresponding parity portion of the combined codeword is to be stored in an additional memory die of the plurality NVM dies. In some embodiments, the first or second error correction scheme is one of: Bose-Chaudhuri-Hocquenghem (BCH) scheme; Low-Density Parity-Check Code (LDDC) scheme; Cyclic Redundancy Check (CRC) scheme; or Convolutional code scheme.

In another example, an apparatus is provided which comprises: means for encoding data with a first error correction scheme to generate a set of codewords, each codeword of the set having a data portion and a corresponding parity portion; means for storing each codeword of the set in a separate memory bank of a memory block; means for encoding the data portions of each codeword of the set with a second error correction scheme, the combined codeword having a data portion and a corresponding parity portion;

and means for storing the corresponding parity portion of the combined codeword in an additional memory bank of the memory block.

In some embodiments, the apparatus comprises: means for encoding the parity portion of the combined codeword to generate a corresponding parity; and means for storing the corresponding parity to the additional memory bank of the memory block. In some embodiments, the apparatus comprises: means for determining which separate memory bank in the memory block failed. In some embodiments, the apparatus comprises: means for decoding the combined codeword after decoding all codewords of the set, and wherein data portions of each codeword of the set comprise the data portion of the combined codeword. In some embodiments, the apparatus comprises: means for correcting at least one of the codewords, stored in the separate memory bank which failed, using the decoded combined codeword.

In another example, a system is provided which comprises: a processor; a SSD coupled to the processor, the SSD including: a plurality of NVM dies; a memory controller coupled to the plurality NVM dies, the memory controller including: means for encoding data with a first error correction scheme to generate a set of codewords, each codeword of the set having a data portion and a corresponding parity portion; means for storing each codeword of the set in a separate memory die of the plurality of NVM dies; means for encoding the data portions of each codeword of the set with a second error correction scheme, the combined codeword having a data portion and a corresponding parity portion; and means for storing the corresponding parity portion of the combined codeword in an additional memory die of the plurality of NVM dies; and a wireless interface for allowing the processor to wirelessly communicate with another device.

In some embodiments, the memory controller comprises: means for encoding the parity portion of the combined codeword to generate a corresponding parity; and means for storing the corresponding parity to the additional memory die. In some embodiments, the memory controller comprises: means for determining which separate memory die, in the plurality NVM dies, failed.

In some embodiments, the memory controller comprises comprising: means for decoding the combined codeword after decoding all codewords of the set, and wherein data portions of each codeword of the set comprise the data portion of the combined codeword. In some embodiments, the memory controller comprising: means for correcting at least one of the codewords, stored in the separate memory die which failed, using the decoded combined codeword.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first encoder to encode data with a first error correction scheme to generate a set of codewords, each codeword of the set having a data portion and a corresponding parity portion, and each codeword of the set to be stored in a separate memory bank of a memory block; and
a second encoder to encode the data portions of each codeword of the set with a second error correction scheme, the second encoder to generate a combined codeword having a data portion and a corresponding parity portion,
wherein the corresponding parity portion of the combined codeword is to be stored in an additional memory bank of the memory block;
wherein the second encoder is to generate the parity portion such that the parity portion of the combined codeword has a size in bits which is at least equal to a size in bits of the data portion of one of the codewords of the set;
wherein the memory bank is a memory die;
wherein when a decoding of a memory block fails, the codewords per die are decoded except for a codeword stored in the failed memory block;
wherein the combined codeword is used to fix a corrupted data in the failed memory block; and
wherein the set of codewords includes nineteen codewords.

2. The apparatus of claim 1, wherein the first encoder is to encode the parity portion of the combined codeword to generate a corresponding parity which is stored in the additional memory bank of the memory block.

3. The apparatus of claim 2 comprising logic to determine which separate memory bank in the memory block failed.

4. The apparatus of claim 1 comprising a first decoder to decode at least one codeword of the set of codewords.

5. The apparatus of claim 1 comprising a second decoder to decode the combined codeword.

6. The apparatus of claim 5, wherein the second decoder is to decode the combined codeword after decoding all codewords of the set, and wherein data portions of each codeword of the set comprise the data portion of the combined codeword.

7. The apparatus of claim 5 comprising a correction logic to correct a codeword, stored in the separate memory bank which failed, using the decoded combined codeword.

8. The apparatus of claim 7, wherein the correction logic is operable to use erasure reconstruction technique to recover the data portion of the codeword, which is stored in the separate memory bank which failed.

9. The apparatus of claim 1, wherein the second encoder is to generate the combined codeword such that the combined codeword has a size which is substantially larger than the size of one of the codewords of the set.

10. The apparatus of claim 1, wherein the second encoder is to generate the combined codeword such that the combined codeword has a size which is substantially equal to a sum of the sizes of the codewords of the set.

11. The apparatus of claim 1, wherein the first error correction scheme is different from the second error correction scheme.

12. The apparatus of claim 1, wherein the first error correction scheme is the same as the second error correction scheme.

13. The apparatus of claim 1, wherein the first or second error correction scheme is one of:
Bose-Chaudhuri-Hocquenghem (BCH) scheme;
Low-Density Parity-Check Code (LDPC) scheme;
Cyclic Redundancy Check (CRC) scheme; or
Convolutional code scheme.

14. The apparatus of claim 1, wherein the memory die is a non-volatile memory die.

15. The apparatus of claim 1, wherein the separate memory banks of the nineteen codewords correspond to nineteen memory dies, and the additional memory bank corresponds to a twentieth memory die.

16. A method comprising:
encoding data in a first encoding with a first error correction scheme to generate a set of codewords, each codeword of the set having a data portion and a corresponding parity portion, and each codeword of the set to be stored in a separate memory bank of a memory block; and
encoding data in a second encoding to encode the data portions of each codeword of the set with a second error correction scheme, the second encoding to generate a combined codeword having a data portion and a corresponding parity portion,
wherein the corresponding parity portion of the combined codeword is to be stored in an additional memory bank of the memory block;
wherein the second encoding is to generate the parity portion such that the parity portion of the combined codeword has a size in bits which is at least equal to a size in bits of the data portion of one of the codewords of the set;
wherein the memory bank is a memory die;
wherein when a decoding of a memory block fails, the codewords per die are decoded except for a codeword stored in the failed memory block;
wherein the combined codeword is used to fix a corrupted data in the failed memory block; and
wherein the set of codewords includes nineteen codewords.

17. The method of claim 16, wherein the first encoding is to encode the parity portion of the combined codeword to generate a corresponding parity which is stored in the additional memory bank of the memory block.

18. The method of claim 17 comprising determining which separate memory bank in the memory block failed.

19. The method of claim 16, comprising:
decoding the combined codeword after decoding all codewords of the set, and wherein data portions of each codeword of the set comprise the data portion of the combined codeword; and
correcting a codeword, stored in the separate memory bank which failed, using the decoded combined codeword.

20. The method of claim 16, wherein the first or second error correction scheme is one of:
Bose-Chaudhuri-Hocquenghem (BCH) scheme;
Low-Density Parity-Check Code (LDDC) scheme;
Cyclic Redundancy Check (CRC) scheme; or
Convolutional code scheme.

21. A system comprising a memory, a processor coupled to the memory, and a wireless interface for allowing the processor to communicate with another device, the processor including:
a first encoder to encode data with a first error correction scheme to generate a set of codewords, each codeword of the set having a data portion and a corresponding parity portion, and each codeword of the set to be stored in a separate memory bank of a memory block; and
a second encoder to encode the data portions of each codeword of the set with a second error correction scheme, the second encoder to generate a combined codeword having a data portion and a corresponding parity portion,
wherein the corresponding parity portion of the combined codeword is to be stored in an additional memory bank of the memory block;
wherein the second encoder is to generate the parity portion such that the parity portion of the combined codeword has a size in bits which is at least equal to a size in bits of the data portion of one of the codewords of the set;
wherein the memory bank is a memory die;
wherein when a decoding of a memory block fails, the codewords per die are decoded except for a codeword stored in the failed memory block;
wherein the combined codeword is used to fix a corrupted data in the failed memory block; and
wherein the set of codewords includes nineteen codewords.

22. The system of claim 21, wherein the first encoder is to encode the parity portion of the combined codeword to generate a corresponding parity which is stored in the additional memory bank of the memory block.

23. The system of claim 22 comprising logic to determine which separate memory bank in the memory block failed.

24. The system of claim 21, wherein the first or second error correction scheme is one of:
Bose-Chaudhuri-Hocquenghem (BCH) scheme;
Low-Density Parity-Check Code (LDPC) scheme;
Cyclic Redundancy Check (CRC) scheme; or
Convolutional code scheme.

* * * * *